(12) United States Patent
Lagowski et al.

(10) Patent No.: US 8,093,920 B2
(45) Date of Patent: Jan. 10, 2012

(54) ACCURATE MEASURING OF LONG STEADY STATE MINORITY CARRIER DIFFUSION LENGTHS

(75) Inventors: Jacek Lagowski, Tampa, FL (US);
Alexandre Savtchouk, Tampa, FL (US);
Marshall D. Wilson, Tampa, FL (US)

(73) Assignee: Semiconductor Diagnostics, Inc., Tampa, FL (US)

(*) Notice: Subject to any disclaimer, the term of this patent is extended or adjusted under 35 U.S.C. 154(b) by 326 days.

(21) Appl. No.: 12/545,345

(22) Filed: Aug. 21, 2009

(65) Prior Publication Data

US 2010/0085073 A1 Apr. 8, 2010

Related U.S. Application Data

(60) Provisional application No. 61/103,007, filed on Oct. 6, 2008.

(51) Int. Cl.
*G01R 31/26* (2006.01)
*G01R 31/302* (2006.01)
*G01R 31/305* (2006.01)
*G01R 31/308* (2006.01)

(52) U.S. Cl. ......... 324/762.01; 324/754.21; 324/754.22; 324/754.23

(58) Field of Classification Search .. 324/762.01–762.1, 324/754.01–754.3, 750.01–750.3; 356/620, 356/433–436, 237.2–237.5; 257/290–292, 257/376, 590; 438/14–18, 920
See application file for complete search history.

(56) References Cited

U.S. PATENT DOCUMENTS

| | | | |
|---|---|---|---|
| 5,025,145 A | 6/1991 | Lagowski | |
| 5,177,351 A | 1/1993 | Lagowski | |
| 5,663,657 A | 9/1997 | Lagowski et al. | |
| 6,512,384 B1 | 1/2003 | Lagowski et al. | |
| 6,922,067 B1 * | 7/2005 | Van et al. | 324/754.23 |
| 7,026,831 B2 * | 4/2006 | Hermes | 324/754.23 |

OTHER PUBLICATIONS

Standard Test Methods for Minority Carrier Diffusion Length in Extrinsic Semiconductors by Measurement of Steady-State Surface Photovoltage, Apr. 1996, ASTM, F391-96.
Present Status of the Surface Photovoltage Method (SPV) for Measuring Minority Carrier Diffusion Length and Related Parameters. Lagowski et.al; Edelman et.al; Faifer et. al. Recombination Lifetime Measurements in silicon, ASTM STP 1340, D.C. Gupta, F.R. Bacher, and W.M. Hughes, Eds., American Society for Testing and Materials, 1998.
Digital SPV Diffusion Length Metrology (E8-Fe) for Ultra-High Purity Silicon Wafers. Wilson et.al; Savtchouk et.al., Tarasov, et. al. D'Amico et.al; Edelman et.al; Kochey et.al; Lagowski et.al. High Purity Silicon vol. 10; Electrical Chemical Society Transactions, 16 (6) 285-301 (2008).
Recent Refinements in the Surface Photovoltage Method for Measuring Very Long Minority Carrier Diffusion Length; Lagowski et.al; Electrochemical Society Proceedings 96-13, pp. 512-522; 1996.

* cited by examiner

*Primary Examiner* — Huy Q Phan
*Assistant Examiner* — Tung X. Nguyen
(74) *Attorney, Agent, or Firm* — Fish & Richardson P.C.

(57) ABSTRACT

Surface photo-voltage measurements are used to accurately determine very long steady state diffusion length of minority carriers and to determine iron contaminant concentrations and other recombination centers in very pure wafers. Disclosed methods use multiple (e.g., at least two) non-steady state surface photovoltage measurements of diffusion length done at multiple (e.g., at least two) modulation frequencies. The measured diffusion lengths are then used to obtain a steady state diffusion length with an algorithm extrapolating diffusion length to zero frequency. The iron contaminant concentration is obtained from near steady state measurement of diffusion length at elevated frequency before and after iron activation. The concentration of other recombination centers can then be determined from the steady state diffusion length and the iron concentration measured at elevated frequency.

17 Claims, 8 Drawing Sheets

ACCURATE MEASURING OF LONG STEADY STATE MINORITY CARRIER DIFFUSION LENGTHS

CROSS-REFERENCE TO RELATED APPLICATIONS

This application claims benefit under 35 U.S.C. 119(e) to Provisional Patent Application No. 61/103,007, entitled "Accurate Measuring Of Long Steady State Minority Carrier Diffusion Lengths," filed on Oct. 6, 2008, the entire contents of which are incorporated herein by reference.

BACKGROUND

This disclosure relates to measuring minority carrier diffusion lengths.

Small signal ac-surface photovoltage (SPV) measurements of minority carrier diffusion lengths can be used as a diagnostic method for monitoring contamination and micro defects in silicon wafers. It can be used for evaluation of crystal growth, ingot to wafer processing and wafer cleaning. It also can be used in integrated circuit (IC) fabs for monitoring wafer contamination (e.g., iron contamination) during key wafer processing steps and/or for requalification of processing tools after repair or maintenance.

SUMMARY

Through the application of SPV measurements, wafer parameters such as steady-state diffusion length, $L_0$, concentration of iron contaminants, $N_{Fe}$, and minority carrier lifetime, $\tau_b$, can be obtained. Moreover, from $L_0$, it is possible to obtain the concentration, $N_R$, of recombination centers other than iron that is used to monitor micro-defect concentrations.

SPV measurement of the minority carrier diffusion length L generally involves illuminating a wafer surface with periodically modulated monochromatic light beams of multiple different wavelengths. A steady state condition and measurement of $L_o$ are realized for sufficiently low modulation frequencies $f \ll D/2\pi L_o^2$, where D is the minority carrier diffusivity. (D is about 30 cm$^2$/s in p-Si wafers most often used in IC manufacturing). For higher frequencies, the measured diffusion length is a function of the modulation frequency, in which the diffusion length decreases as modulation frequency increases. The resulting underestimation of L would cause overestimation of the contaminant and micro defect concentration. At present, the high purity silicon wafers have steady state diffusion lengths exceeding 1000 μm and often even 2000 μm. For such wafer the modulation frequency giving steady state condition is generally 30 Hz or less. The SPV measurement with light modulation frequency of so a low value would be inaccurate and impractical. It would lead to inferior signal to noise ratio in SPV measurement degrading precision of diffusion length determination. To increase signal to noise ratio very long signal monitoring time constants would be required, leading to very slow measurements, unable to meet the needs for fast large diameter wafer mapping across 400 to 6000 separate sites in time of a few minutes required for contamination monitoring. Furthermore, such very low frequency measurements can be imprecise due to signal instabilities caused by the surface lifetimes, $\tau_S$. Prior SPV diffusion length methods and equations used by them were developed assuming that SPV measurements are done under steady state condition. This preludes using elevated frequency for long diffusion lengths. On the other hand, measurement of diffusion lengths at high modulation frequencies under non-steady state condition can involve complex equations that are cumbersome for practical use.

The present disclosure relates to determining steady-state diffusion lengths $L_0$ based on measurements of diffusion lengths under non-steady state conditions at multiple elevated light modulation frequencies in which quick and reliable measurements of diffusion length values for high purity semiconductor wafers can be obtained.

Advantages of this technique include, for example, extending the accurate measurement of low concentrations of metal contaminants. For example, accurate measurement of iron in silicon wafer at concentrations as low as 10$^8$ atoms/cm$^3$ can be achieved. The use of elevated frequencies enables, in some implementations, fast data acquisition and high precision measurements of diffusion lengths. Moreover, measuring diffusion lengths at elevated frequencies can reduce the effect of changes and drifts due to surface contamination, ambient changes and adsorption/desorption of polar molecules on the wafer surface, such that the influence of surface lifetime $\tau_S$ on diffusion length measurements also is reduced.

The details of one or more embodiments of the invention are set forth in the accompanying drawings and the description below. Other features, objects, and advantages of the invention will be apparent from the description and drawings, and from the claims.

DETAILED DESCRIPTION

Continuous progress in purity of silicon crystal growth and wafer processing requires measuring concentrations of iron and other recombination centers at ever lower values as well as measuring higher values of both steady-state diffusion lengths, $L_0$, and minority carrier recombination lifetimes, $\tau_b$. For example, advanced ultra-pure 300 mm diameter p-type Si wafers can require measurements of $N_{Fe}$ as low as 10$^8$ atoms/cm$^3$ (e.g., about 10$^{10}$ atoms/cm$^3$ or less, 10$^9$ atoms/cm$^3$ or less), $N_R$ in the range of 10$^{10}$ centers/cm$^3$ or less, $L_0$ about 1000 μm or more, and $\tau_b$ about 0.3 ms or more.

Figure 1:
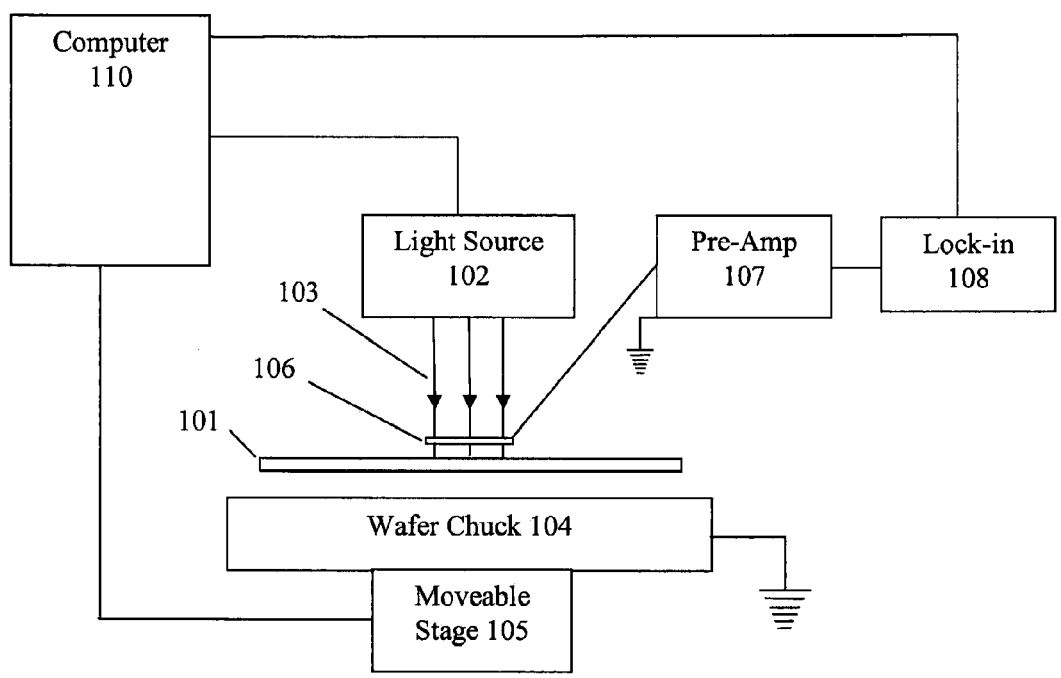
FIG. 1 is an example of a surface photo-voltage measurement system.

A variety of SPV methods are known to those skilled in the art. An example of the surface photovoltage measurement system is described in the American Society for Testing and Materials publication "Standard Test Methods for Minority Carrier Diffusion Length in Extrinsic Semiconductors by Measurement of Steady-State Surface Photovoltage," ASTM Designation: F 391-96 (1996), the entire contents of which is incorporated herein by reference. FIG. 1 shows an embodiment of such a surface photo-voltage measurement system 100. The system 100 includes a light source 102, a wafer support 104 (e.g., a wafer chuck) on a moveable stage 105, an SPV pick-up electrode 106, that is transparent, preamplifier 107, and a lock-in amplifier 108. The light source 102, moveable stage 105, pre-amplifier 107 and lock-in amplifier 108 are controlled by a computer 110. A wafer 101 positioned on the wafer support 104 is capacitively connected to the pick-up electrode 106. Similarly, the wafer 101 is capacitively connected to the ground via the wafer support 104.

In the embodiment shown in FIG. 1, the light source 102 emits monochromatic light beams with modulated intensity 103 that illuminate the wafer through the transparent SPV pick-up electrode 106. The light source 102 can include, but is not limited to, light emitting diodes (LEDs) and/or fiber optics and a digital light source controller. In certain embodiments, the light source does not include moving parts so as to reduce mechanical vibrations and improve system reliability. Narrow band-pass filters can be used to define the selected wavelengths from broader LED spectrum. The wavelengths used range from about 0.8 um to about 1 um. The filter can include, but is not limited to, a band-pass of about 3 to about 5 nm. In some cases, the light source 102 includes sets of paired LEDs having different emission spectra selected to obtain light beams at a given wavelength with intensity that is temperature independent. Light emitted by light source 102 can be modulated up to frequencies of about 3000 Hz or more. In some cases, the fiber optic cables transmit light from the light source 102 to the transparent pick-up electrode 106 and to the wafer surface. Operation of the lock-in amplifier 108, the light source controller 102 and the wafer positioning stage 105 can be controlled by the computer 110.

The system 100 enables mapping of whole wafers. This can be achieved by moving wafer 101 on moveable stage 105 relative to SPV pick-up electrode 106.

The pick-up electrode 106 detects changes in the wafer surface potential that result from variations in minority carrier concentration caused by illumination of the wafer based on a capacitive coupling between the electrode and wafer. The electrode 106 can include a transparent substrate, such as glass or quartz, on which a transparent conducting film of indium tin oxide is deposited. The electrode 106 is positioned near, but not in contact with, the wafer surface. Electrode 106 can be positioned within about 0.2 mm (e.g., within 0.15 mm or within 0.25 mm) of the wafer surface.

During operation, the wafer is illuminated under the electrode 106. The voltage on pick-up electrode 106 is measured using preamplifier 107 and lock-in amplifier 108, and can be recorded using the computer 110.

Figure 2:
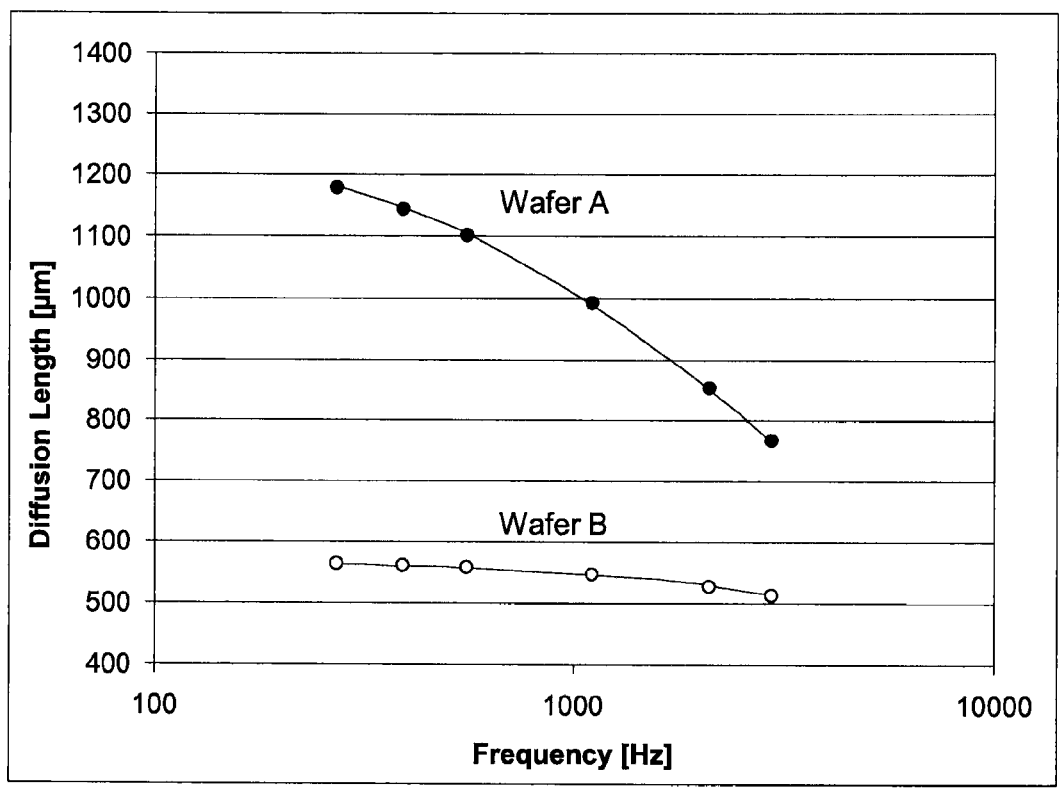
FIG. 2 shows a plot of diffusion length versus light modulation frequency.

SPV measurement of the minority carrier diffusion length is based on monitoring surface photovoltage signals generated by incident light beams with different wavelengths, at least two different wavelengths that give different penetration depth, at least two different penetration depths, beneath the wafer surface. The intensity of incident monochromatic light beams provided by the light source 102 are periodically modulated with an angular modulation frequency, $\omega = 2\pi f$, where f is the frequency. In some embodiments, modulation is performed digitally via a current supplied to LEDs. For fast wafer mapping, it is preferable that a high frequency is used to enable fast data acquisition. For example, frequencies of 500 Hz or more, 750 Hz or more and 1000 Hz or more can be used. However, for long steady state diffusion length, the measured diffusion lengths tend to decrease at higher frequencies. FIG. 2 shows a plot of diffusion length versus light modulation frequency. It is seen that L decreases slowly with frequency in low frequency range and more rapidly at higher frequencies. The effect is stronger for wafer A, i.e., the ultra-clean wafer with longer L value than that for the less clean wafer B with shorted L.

In some cases, the steady-state value $L_0$ can be determined using the empirical saturation value of L in the low frequency. However, this procedure generally requires multiple measurement in low frequency range that are not only slow, but imprecise due to SPV noise at low frequencies, and also due to signal instabilities caused by adsorption/desorption of polar molecules on the wafer surface, ambient changes and surface contamination, which can affect surface lifetime $\tau_S$. Accordingly, precise and fast wafer steady-state diffusion length measurement may not be feasible using low frequency modulated light.

Frequency dependent diffusion length was previously theoretically considered. However this treatment involves complex SPV equations that are too cumbersome for practical use (see, for example, treatment by J. Lagowski, V. Faifer and P. Edelman, *Electrochem. Soc. Proc.* 96-13, 512 (1996), and eqn. 4 therein).

Figure 3:
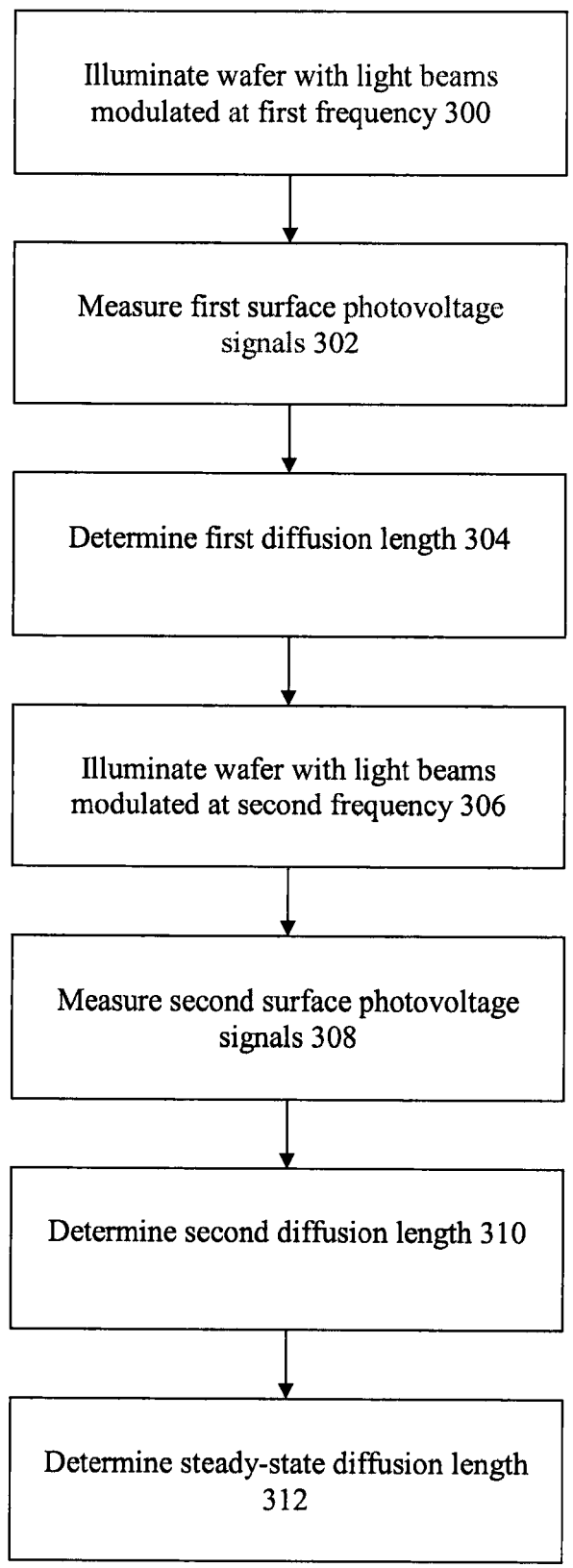
FIG. 3 is a flow chart illustrating a method of determining a steady-state diffusion length using SPV.

FIG. 3 is a flow chart illustrating a method of determining a steady-state diffusion length using SPV, in which the diffusion length L is measured at two different non steady-state frequencies, both of which are in a relatively high frequency range. Using the measured values of L at the different frequencies (i.e., $L_1(\omega_1)$ and $L_2(\omega_2)$), a linear relationship is obtained between $L^{-2}$ and $\omega$, in which the steady-state diffusion length $L_0$ is determined for $\omega=0$. As a result, fast and precise measurement of steady-state diffusion length values can be obtained. This fast measurement enables high density mapping of $L_o$ on large wafers in which about 400 to about 6000 sites are measured.

At (300), a wafer is illuminated with monochromatic light beams that are periodically modulated with a first frequency, $\omega_1$. For diffusion length, the surface photovoltage (SPV) is measured at (302) for a minimum of two different wavelengths. Using the recorded SPV values, a first diffusion length, $L_1$ is calculated at (304). The wafer then is illuminated at (306) with monochromatic light beams modulated with a second frequency $\omega_2$. During this subsequent illumination with light beams modulated at a second frequency, the SPV again is measured at (308) for a minimum of two different wavelengths. Based on the measurement, a second diffusion length corresponding to $\omega_2$ is calculated at (310). A steady-state diffusion length then is determined at (312) based on the values of the first and second diffusion lengths and corresponding light modulation frequencies.

In ac-SPV measurement of diffusion lengths, the monochromatic incident light, beams with wavelengths $\lambda_K$, generate excess minority carriers with different concentration profiles beneath the surface as determined by the light penetration depths $z_K(\lambda_K)$. The excess carriers recombine and redistribute due to diffusion. The final profile is determined by z and by the minority carrier diffusion length, $L=(D\tau_b)^{1/2}$, where D is the diffusivity and $\tau_b$ is the bulk recombination lifetime.

The minority carrier profile follows a steady-state value of $L=L_0$ for low light modulation frequencies, i.e., when $\omega\tau_b \ll 1$ or $f \ll D/2\pi L_o^2$. With increasing light modulation frequency, however, $\omega\tau_b$ increases and the carrier profile changes giving an effective diffusion length value L that is lower than $L_0$ and that is dependent on the frequency.

The bulk lifetime is not the only time constant involved in SPV. SPV is based on monitoring a change of the wafer surface potential, picked-up by the transparent electrode 106 placed above the wafer surface. This requires a depletion type surface space charge region (SCR) with a surface barrier, $V_{SB}$, that is very sensitive to the minority carrier concentration near the surface. The surface SCR works as a detector of photogenerated minority carrier concentration near the surface.

This space charge is characterized by the depletion capacitance, $C_D$, and the recombination resistance, R, that give a surface time constant, $\tau_S=C_D R$, referred to as the surface lifetime. The overall expression for the amplitude of the ac-SPV signal, V(z, ω), can be expressed as:

$$V(z, \omega) = const \cdot \phi_{\it eff} f(z, L) \tau_S / C_D \sqrt{1 + \omega^2 \tau_S^2} \qquad [1]$$

where $$f(z, L) = (1 - Bz/L)/(1 - z^2/L^2) \qquad [2]$$

$$B = \frac{(D/S_B L)\sinh(T/L) + \cosh(T/L)}{\sinh(T/L) + (D/S_B L)\cosh(T/L)} \qquad [3]$$

$\phi_{\it eff}$ is the effective photon flux, $S_B$ is the back surface recombination velocity and T is the wafer thickness.

To determine the diffusion length, L, the surface photovoltage generated by modulated incident light is measured at a minimum of two different light wavelengths (different z values). The ratio of the signals $V(z_1)/V(z_2)|_{\omega=const}=f(z_1)/f(z_2, L)$ eliminates all factors in Equation 1 except the theoretically known function $f(z, L)$. Fitting the SPV signal ratio to a theoretical expression derived from equation 2 and 3 gives L as an iterative parameter. For L short compared to the thickness of the wafer, the equation 3 simplifies to B=1. For long diffusion lengths, B is no longer one and its specific value depends on the value of $S_B$ that can vary depending on the wafer treatment. In SPV metrology, the value of $S_B$ should be used to calculate long L values exceeding about 60% of the wafer thickness as described in U.S. Pat. No. 5,663,657, for example. The entire contents of U.S. Pat. No. 5,663,657 are incorporated herein by reference.

For low light modulation frequency range, $\omega\tau_b\ll 1$, this procedure gives diffusion length equal to the steady state value. For higher frequencies this procedure gives the effective diffusion length value, L, that depends on the frequency.

For frequency up to about 3 kHz, $L^{-2}$ follows a linear dependence on light modulation frequency.

$$L^{-2}(\omega)=L_0^{-2}+A\omega \qquad [4]$$

where $\omega=2\pi f$, $L_0=(D\tau_b)^{1/2}$ and A is the constant.

Figure 4:
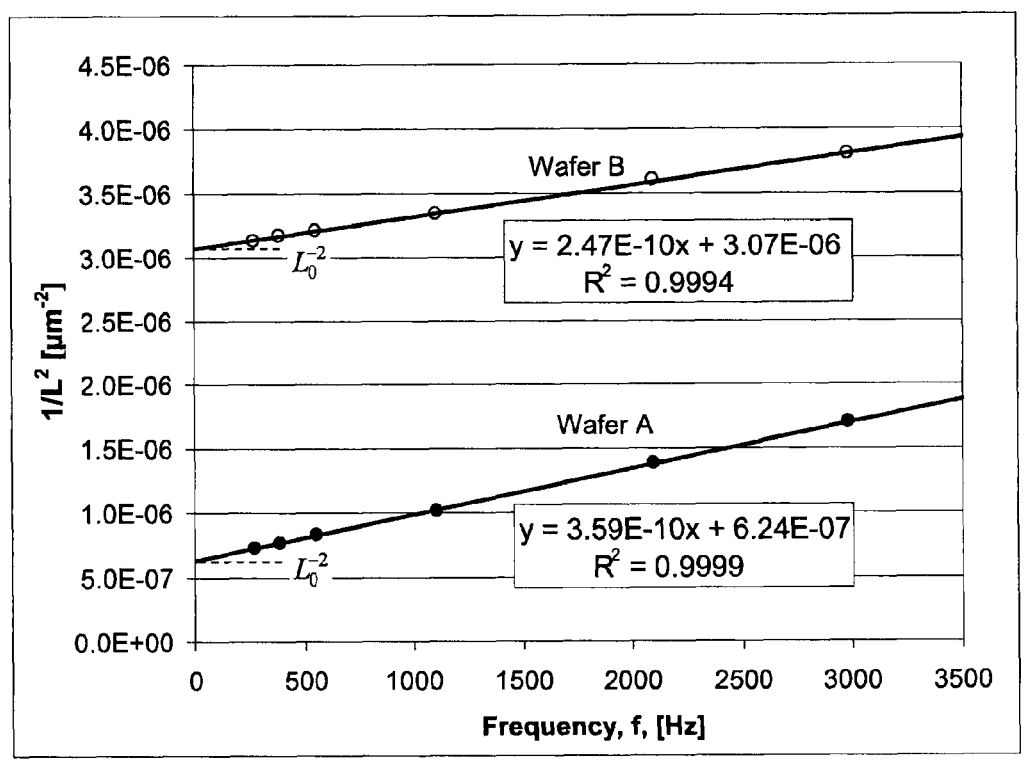
FIG. 4 shows a plot of $L^{-2}$ versus light modulation frequency.

FIG. 4 shows a plot of $L^{-2}$ versus light modulation frequency in which data from FIG. 2 is re-plotted in accord with Equation 4. The plots are linear with excellent correlation coefficient $R^2$ very close to 1. Extrapolation to zero frequency, ω=0 gives the $L_0^{-2}$ values. The corresponding steady state diffusion length values $L_0$ values of 1266 μm and 571 μm are obtained for the wafer A and B respectively.

Figure 5:
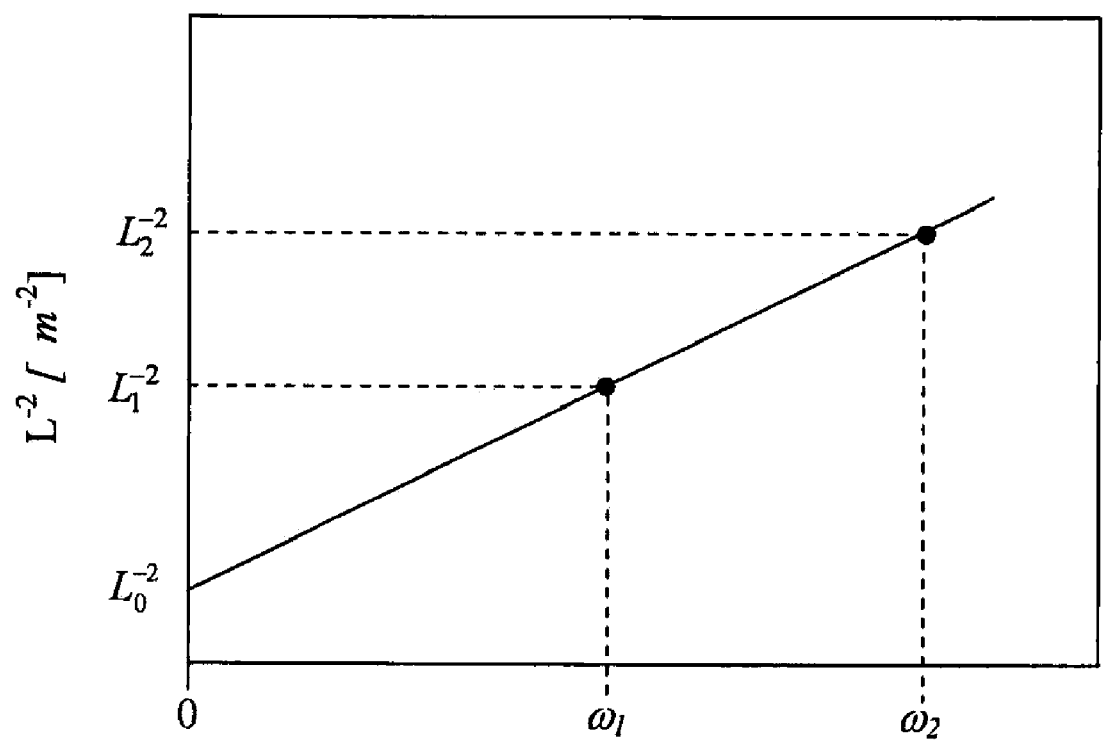
FIG. 5 shows an example of a plot used to determine steady-state diffusion value.

Accordingly, using the equation 4, the steady-state diffusion length value $L_0$ can be determined from non-steady state SPV diffusion length measurements performed at a minimum of two distinct modulation frequencies. FIG. 5 shows an example of a plot used to determine steady-state diffusion value. The first diffusion length $L_1$ is measured at $\omega_1$ and the second diffusion length $L_2$ is measured at $\omega_2$. Corresponding $L_1^{-2}$ and $L_2^{-2}$ are then calculated. The plot of this data is shown in FIG. 5. $L_0^{-2}$ is then calculated using $L_1^{-2}$ and $L_2^{-2}$ and equation 4.

$$L_0^{-2}=L_2^{-1}-\omega_2(L_2^{-2}-L_1^{-2})/(\omega_2-\omega_1) \qquad [5a]$$

the same set of equations gives the frequency slope parameter $$A=(L_2^{-2}-L_1^{-2})/(\omega_2-\omega_1) \qquad [5b]$$

To calculate $L^{-2}(\omega)$ for any arbitrary ω and to obtain corresponding L(ω), the equation 5a is modified as $$L^{-2}=L_2^{-1}-\omega(L_2^{-2}-L_1^{-2})/(\omega_2-\omega_1) \qquad [5c]$$

Recalculation of L(ω), is in itself of practical value in matching tools, or comparing data obtained at different frequencies.

Furthermore, once the steady-state value $L_0$ is known, other parameters can be obtained as well. For example, bulk recombination lifetime can be obtained using the equation $\tau_b=L_0^2/D$.

SPV measurements also can be used to determine a concentration of iron and other recombination centers. Unlike SPV steady-state diffusion length measurements, in which diffusion lengths are measured at a minimum of two different modulation frequencies, SPV measurements of iron or copper concentration entails determining the diffusion length L at a single modulation frequency. Individual contributions of given contaminants, e.g., iron can be separate from that of other recombination centers by manipulation of $L^{-2}$ measured before and after wafer treatments ($L_{before}^{-2}$ and $L_{after}^{-2}$, respectively) that selectively change the recombination activity of individual contaminants, e.g. of iron. Such treatments are known for Fe and Cu and they involve strong illumination and/or thermal treatment. For example, strong illumination of silicon can lead to photo-dissociation of iron-boron pairs that are weak recombination centers and the creation of iron interstitials that are very effective recombination centers. Similarly, annealing at 200° C. for 5 minutes can disassociate Fe—B pairs and Cu—Cu pairs to increase the recombination activity of both of these contaminants. An 85° C. anneal for 10 minutes, on the other hand, will repair Fe and B and will cause a decrease in recombination activity of Fe without changing the activity of Cu.

The iron concentration in atoms/cm$^3$ can be expressed as:

$$N_{Fe}=1.06\times10^{16}(L_{after}^{-2}-L_{before}^{-2}) \qquad [6]$$

where L is in μm.

As explained above, $N_{Fe}$ is determined by performing non-steady state diffusion length measurements $L_{before}$ and $L_{after}$ at one elevated frequency. Using equation 4 it is possible to show that the $N_{Fe}$ value calculated from equation 6 will be the same irrespective of the specific frequency of light modulation, ω, at which $L_{before}$ and $L_{after}$ were measured. Accordingly from Equation 4, one gets $L_{after}^{-2}=L_{0\_after}^{-2}+A\omega$ and $L_{before}^{-2}=L_{0\_before}^{-2}+A\omega$. In the difference, $L_{after}^{-2}-L_{before}^{-2}$, the term Aω cancels. Therefore as long as $L_{after}^{-2}$ and $L_{before}^{-2}$ are measured at the same frequency, their difference is independent of frequency and so is $N_{Fe}$, determined by this difference.

Figure 6:
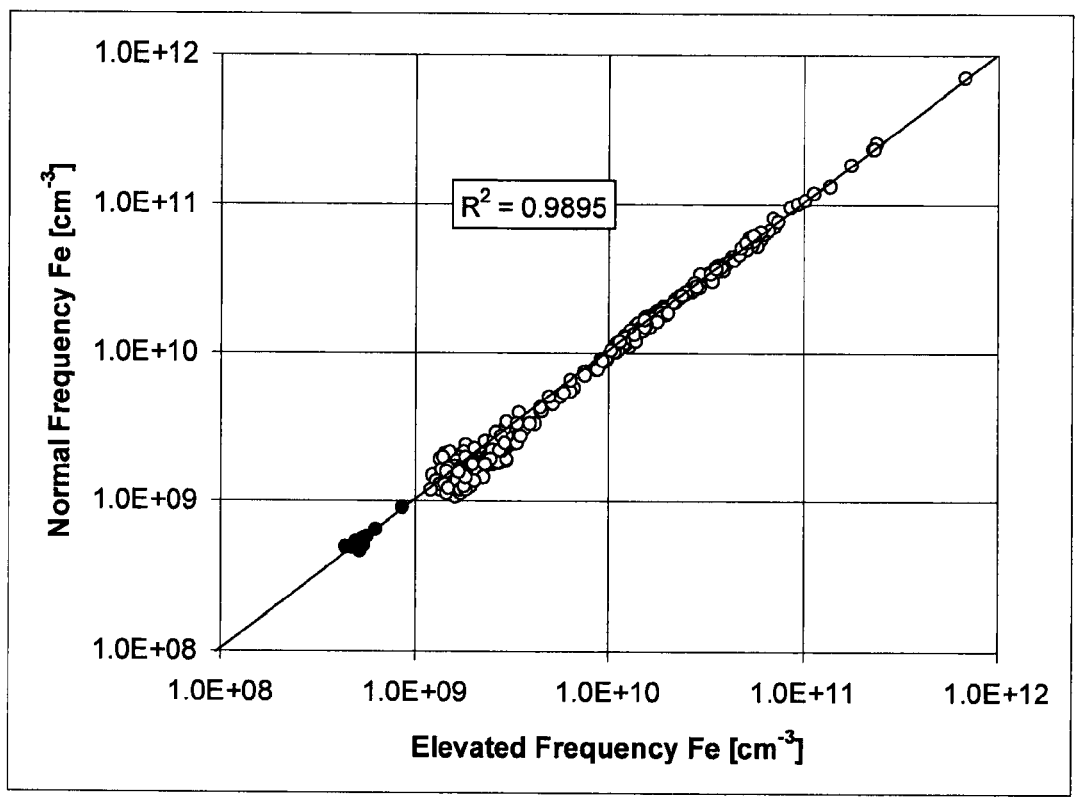
FIG. 6 shows a graph displaying iron contaminant concentration measured at a first frequency versus iron contaminant concentration measured at a second frequency.

FIG. 6 shows a graph displaying iron contaminant concentration measured at one frequency versus iron contaminant concentration measured at a second frequency. In particular, FIG. 6 shows $N_{Fe}$ measured at 558 Hz compared to $N_{Fe}$ measured at a substantially higher frequency 2,980 Hz. 558 Hz is referred to as "normal frequency" because it falls in a frequency range used in conventional methods. As seen from the figure, there is a one to one correlation over 3 orders of magnitude of $N_{Fe}$. The data above $1\times10^9$ corresponds to a 15×15 mapping of the wafer surface. For such a measurement, $N_{Fe}$ error at 558 Hz is about 3 times larger than at an elevated frequency 2980 Hz. Therefore, most of the spreading around the 1 to 1 line is attributed to measurement done at 558 Hz. In the $10^8$ atoms/cm$^3$ range, 558 Hz mapping becomes very unreliable. Therefore, measurements in this very low iron concentration range (filled circles) can be obtained using data averaging applied to 9 site per wafer measurement, rather than the whole wafer mapping.

In some implementations, elevated frequency measurement enables faster data acquisition and higher precision. The latter is due to optimization of SPV measurement with respect to stability. At elevated frequency $\omega\tau_S\gg 1$. According to equation 1 this eliminates an influence of the surface lifetime, $\tau_S$, on SPV signal (indeed, for $\omega\tau_S\gg 1$, the term containing $\tau_S$ cancels in the SPV signal Equation 1). The surface lifetime value is susceptible to changes and drifts due to surface contamination, ambient changes and adsorption/desorption of polar molecules. These factors create SPV stability issues during lower frequency measurement and can degrade mea- An example of such an output parameter set is given in Table 1 for a 5-site measurement of a high purity 300 mm p-Si wafer.

TABLE 1

| | Parameters obtained with digital SPV using two frequency monitoring. | | | | | |
|---|---|---|---|---|---|---|
| | (0, 0) | (−94, 0) | (0, −94) | (94, 0) | (0, 94) | Average |
| $L_0$ [μm] | 1108 | 1127 | 1081 | 1108 | 1106 | 1106 |
| $\tau_b$ [ms] | 0.372 | 0.385 | 0.354 | 0.372 | 0.371 | 0.371 |
| Fe [cm$^{-3}$] | 1.27E+09 | 6.92E+08 | 7.58E+08 | 7.85E+08 | 8.96E+08 | 8.80E+08 |
| $N_R$ [cm$^{-3}$] | 7.74E+09 | 7.53E+09 | 8.18E+09 | 7.78E+09 | 7.79E+09 | 7.80E+09 | surement repeatability. However, increasing the modulation frequency to about 3 kHz from 558 Hz can reduce the effect of changes in surface lifetime and thus improve the stability and the precision of contaminant concentration measurement.

Figure 7:
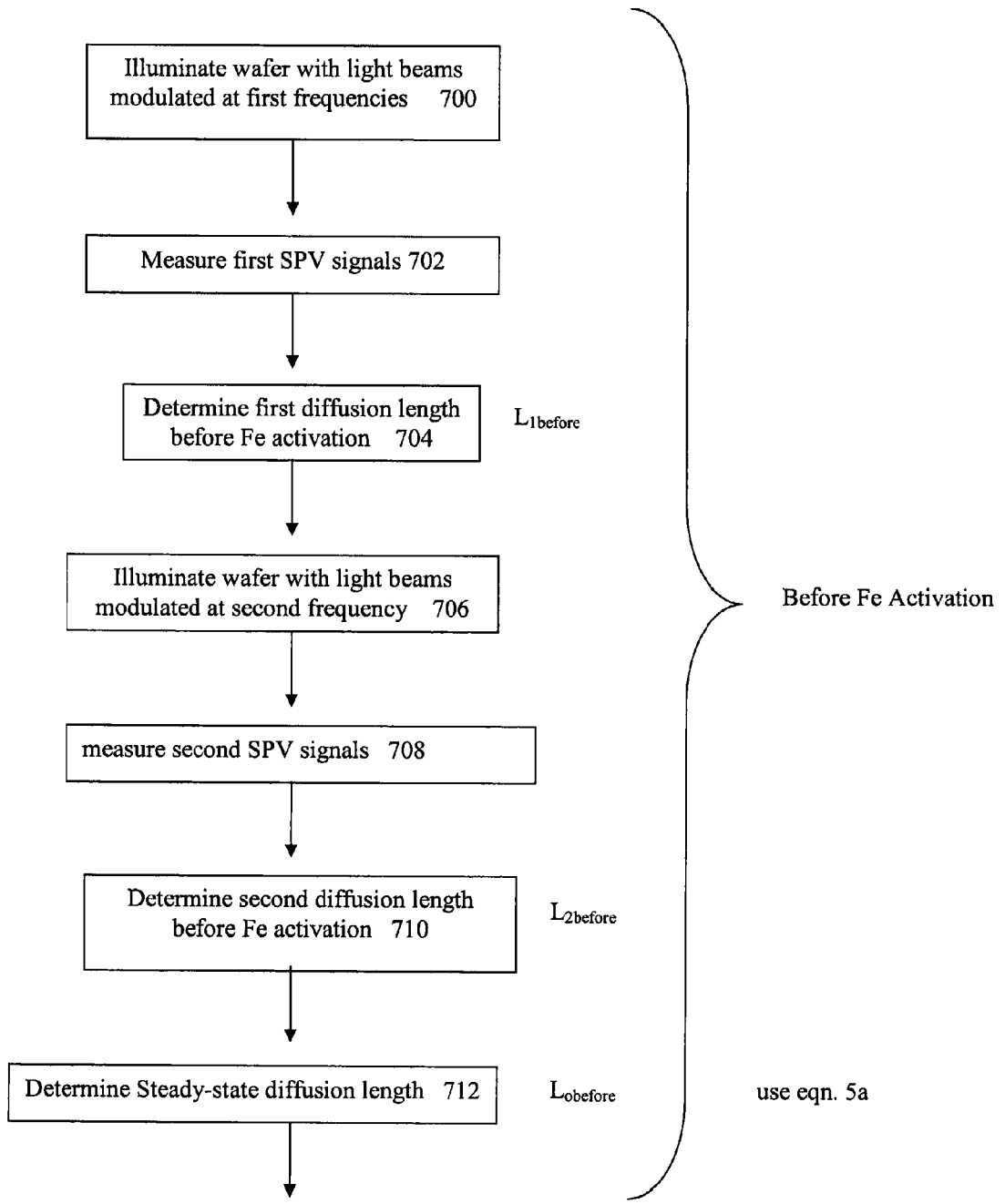
FIG. 7 is a flow chart illustrating a method of determining a contaminant concentration using SPV.
Figure 7:
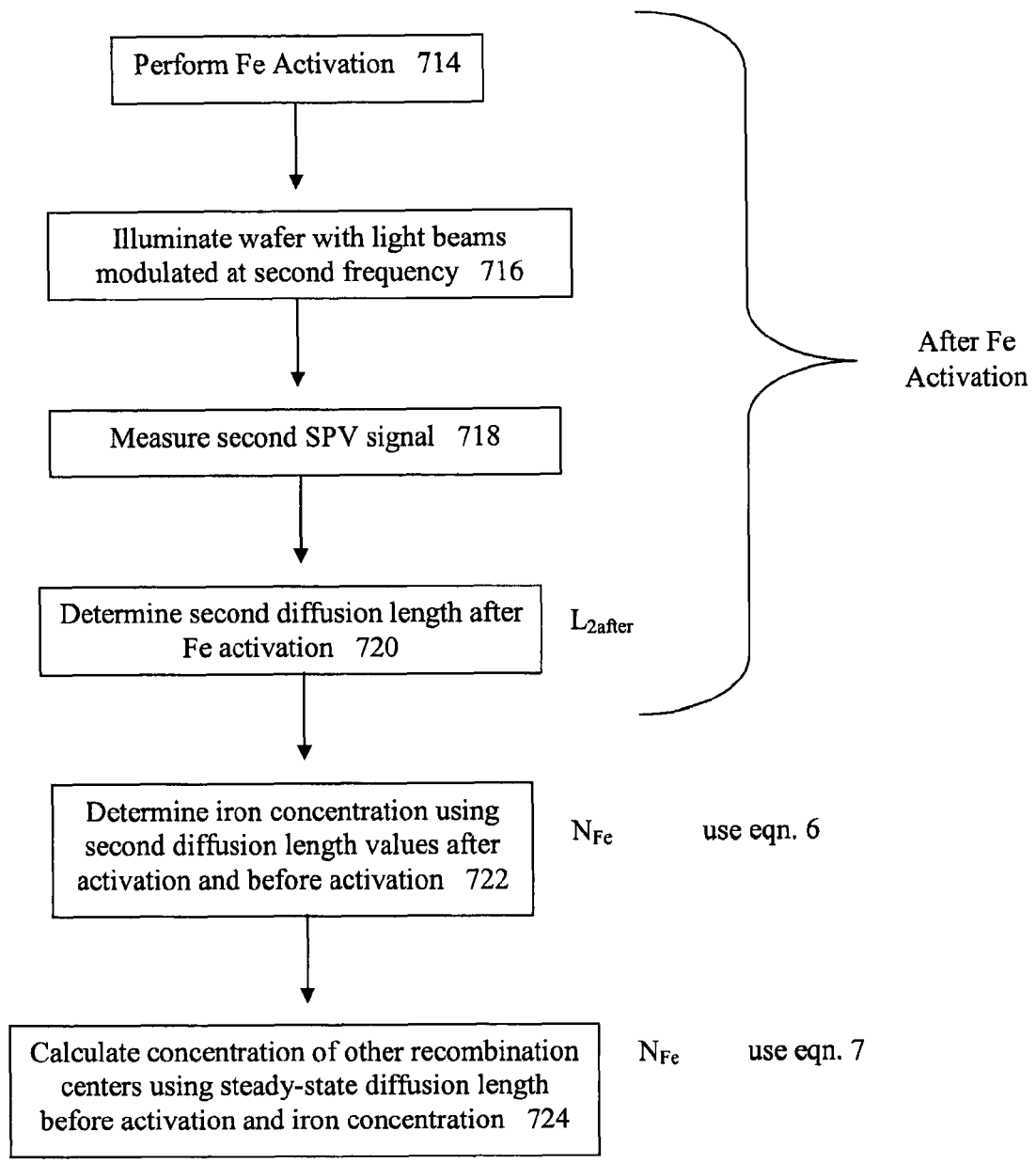

FIG. 7 is a flow chart illustrating a method of determining Fe concentration, and the concentration of other recombination centers $N_R$ and the $L_o$, using three measurements of non-steady state diffusion length. One measurement is done at first frequency before Fe activation. Second and third measurements are done at a second frequency (higher than the first one) before and after Fe activation, respectively. As shown in FIG. 7, the wafer is illuminated at (700) with monochromatic light beams modulated at the first frequency ($\omega_1$). During illumination, a minimum of two SPV signals are measured at (702), corresponding to two different wavelengths. A first diffusion length ($L_{1before}$) before iron activation is then determined at (704) based on the measured signals at (702). The wafer is again illuminated at (706) and SPV measurement is done at a second elevated frequency ($\omega_2$). A minimum of two SPV signals are measured at (708) at the $\omega_2$ frequency from which a second diffusion length ($L_{2before}$) before Fe activation is determined at (710). Once the diffusion lengths ($L_{1before}$ and $L_{2before}$) measured at the two frequencies ($\omega_1$ and $\omega_2$) are obtained, the steady-state diffusion length ($L_{0before}$) is then determined at (712). In this procedure the diffusion length values L are determined using the full form of equation 2 with constant B given by equation 3. To use this full form, the back surface recombination, $S_B$, is needed. (If it is not known it can be measured before the sequence shown in FIG. 7). The wafer then is treated (i.e., Fe activation) at (714) which increases the recombination efficiency of iron contaminants. After activation, the wafer is illuminated at (716) with monochromatic light beams modulated at the second frequency ($\omega_2$) and SPV signals are measured at this frequency (718). The diffusion length after activation ($L_{2after}$) at the second frequency is determined at (720). Once the diffusion lengths before and after activation ($L_{2before}$ and $L_{2after}$) for the second elevated frequency are obtained, the Fe concentration ($N_{Fe}$) can be calculated at (722) using equation 6. Once the Fe concentration is obtained, the concentration of other recombination centers also can be determined at (724). The other recombination centers are calculated from $L_0^{-2}$ after subtracting the contribution from Fe. The formula for calculation of $N_R$ using $L_{0before}$ determined at (712) and Fe concentration, $N_{Fe}$, determined at (722) is:

$$N_R = 1.06(1 - P^{-1})e16 L_0^{-2} - N_{Fe}/P \quad [7]$$

where $N_R$ is in centers/cm$^3$, $L_0$ is in μm. P=12 is the recombination cross section ratio between isolated Fe and iron-boron pair.

It will be understood that various modifications may be made without departing from the spirit and scope of the invention. Other embodiments are within the scope of the claims.

What is claimed is:

1. A method for determining steady state diffusion length of minority carriers, $L_0$, in semiconductor wafer, from the measurement of at least two diffusion length values $L_1$ and $L_2$, under non-steady state conditions at frequencies $\omega_1$, and $\omega_2$, respectively, the method comprising:
   illuminating a wafer surface with light, which is modulated at a first frequency, $\omega_1$;
   monitoring first surface photovoltage signals of the wafer during illumination with the light modulated at the first frequency;
   determining a first diffusion length, $L_1$, based on the first surface photovoltage signals;
   illuminating a wafer surface with light, which is modulated at a second frequency, $\omega_2$, where the first and second frequencies are different;
   monitoring second surface photovoltage signals of the wafer during illumination with the light modulated at the second frequency;
   determining a second diffusion length, $L_2$, based on the second surface photovoltage signals; and
   calculating a third diffusion length, $L_3$ corresponding to a third frequency, $\omega_3$, different from the first and second frequencies, based on a relationship relating diffusion length at different frequencies.

2. The method of claim 1, wherein the third diffusion length, $L_3$, is the steady state diffusion length, $L_0$, where $\omega_3$=0.

3. The method of claim 2, where the relationship relating diffusion length at different frequencies used to determine $L_0$ is a linear relationship between $L^{-2}$ and $\omega$ given by the equation $L^{-2} = L_o^{-2} + A\omega$.

4. The method of claim 2, wherein a steady state value of the bulk lifetime, $\tau_b$, is determined from $L_0$, $\tau_b = L_0^2/D$.

5. The method of claim 1, wherein the semiconductor wafer is the silicon wafer.

6. A method of claim 1, wherein the first and second frequencies differ by 100 Hz or more.

7. The method of claim 1, wherein the higher of the first and second frequencies is 3000 Hz or less.

8. The method of claim 7, wherein the lower of the first and second frequencies is 270 Hz or more.

9. The method of claim 1, wherein illuminating a wafer surface with the light modulated at the first frequency is done for multiple wavelengths.

10. The method of claim 1, wherein $L_1$ is determined from multiple surface photovoltage signals is based on an algorithm for a long diffusion length measurement.

11. The method of claim 8, wherein illuminating a wafer surface with the light modulated at the second frequency is done for multiple wavelengths.

12. The method of claim 1, wherein $L_2$ is determined from multiple surface photovoltage signals is based on an algorithm for a long diffusion length measurement.

13. The method of claim 1, wherein the surface photovoltage signals are monitored using a non-contact probe.

14. The method of claim 1, wherein three or more measurements of non-steady state diffusion lengths $L_1, L_2 \ldots L_k$, at corresponding frequencies $\omega_1, \omega_2 \ldots \omega_k$ are used to determine the steady state diffusion length value $L_o$ or the diffusion length at a frequency not belonging to the set $\omega_1 \ldots \omega_k$.

15. The method of claim 1, further comprising:
   determining an iron concentration in the wafer from measurements of non-steady state diffusion length, the method comprising:
   measuring a non-steady state diffusion length at a frequency, $\omega$ before activation of iron ($L_{before}$),
   activating iron by illuminating the wafer with strong light to decompose iron-boron pairs;
   measuring a non-steady state diffusion length at the frequency, $\omega$ after iron activation ($L_{after}$),
   calculating iron concentration, $N_{Fe}$, based on $L_{before}$ and $L_{after}$.

16. The method of claim 1, wherein the steady state diffusion length $L_0$ and iron concentration, $N_{Fe}$, are used to calculate the concentration of other recombination centers, $N_R$, using the equation:

$$N_R = 1.06(1-P^{-1})e16L_0^{-2} - N_{Fe}/P,$$

where P is the recombination cross section ratio between isolated iron and iron-boron pairs.

17. A method of claim 1, wherein determining the $L_0$ is done for multiple sites of the semiconductor wafer.

* * * * *